United States Patent
Huang et al.

(10) Patent No.: US 6,567,446 B1
(45) Date of Patent: May 20, 2003

(54) OPTICAL DEVICE WITH INCREASED SPECTRAL WIDTH

(75) Inventors: Sun-Yuan Huang, Union City, CA (US); Kenneth L. Bacher, Macungie, PA (US); Si Hyung Cho, Macungie, PA (US); William Crossley Dautremont-Smith, Orefield, PA (US)

(73) Assignees: Agere Systems Inc, Allentown, PA (US); TriQuint Technology Holding Co, Hillsboro, OR (US)

( * ) Notice: Subject to any disclaimer, the term of this patent is extended or adjusted under 35 U.S.C. 154(b) by 0 days.

(21) Appl. No.: 09/640,289

(22) Filed: Aug. 16, 2000

(51) Int. Cl.[7] .................................................. H01S 5/00
(52) U.S. Cl. .......................................... 372/46; 372/96
(58) Field of Search ............................. 372/46, 45, 50, 372/96; 359/124

(56) References Cited

U.S. PATENT DOCUMENTS

| | | | |
|---|---|---|---|
| 4,251,780 A | * 2/1981 | Scifres et al. ................. | 372/46 |
| 5,105,431 A | * 4/1992 | Tanaka ......................... | 372/46 |
| 5,392,308 A | * 2/1995 | Welch et al. ................. | 372/45 |
| 5,394,429 A | 2/1995 | Yamada et al. ............... | 372/96 |
| 5,657,339 A | * 8/1997 | Fukunaga .................... | 372/50 |
| 5,689,358 A | 11/1997 | Nakao et al. ................ | 359/248 |
| 5,936,991 A | * 8/1999 | Lang et al. ................... | 372/50 |
| 6,052,393 A | 4/2000 | Islam ............................ | 372/6 |
| 6,301,283 B1 | 10/2001 | Chen et al. ................... | 372/96 |

FOREIGN PATENT DOCUMENTS

| | | | | |
|---|---|---|---|---|
| JP | 60 072284 A | 4/1985 | ............. | H01S/3/18 |
| JP | 11 214793 A | 8/1999 | ............. | H01S/3/18 |

OTHER PUBLICATIONS

European Search Report, dated Nov. 7, 2002.
Article by Kito et al, "High Slope Efficiency and Low Noise Characteristics . . . ", IEEE Journal of Quantum Mechanics, vol. 35, No. 12, pp. 1765–1770 (Dec. 1999).

* cited by examiner

Primary Examiner—Quyen Leung
(74) Attorney, Agent, or Firm—Lester Birnbaum

(57) ABSTRACT

The invention is an optical apparatus and method of fabrication wherein an optical device such as a semiconductor laser includes a grating and a waveguide optically coupled to the grating. At least a portion of the waveguide coupled to the grating has a width which varies along the length of the waveguide in such a manner as to broaden the spectral line width of light output from the device. The width can be varied according to linear, sinusoidal or saw-tooth functions. A broadened line width permits pumping of a Raman amplifier at a high power without inducing any significant Brillouin Scattering.

21 Claims, 6 Drawing Sheets

US 6,567,446 B1

OPTICAL DEVICE WITH INCREASED SPECTRAL WIDTH

FIELD OF THE INVENTION

This invention relates to optical devices such as semiconductor lasers.

BACKGROUND OF THE INVENTION

Optical Networks are currently of great interest primarily due to their ability to carry a large amount of information. Particularly significant are Dense Wavelength Division Multiplexing (DWDM) Systems which carry several wavelengths in a single optical fiber. Important components of such systems are Raman fiber amplifiers, which allow long-haul transmission of the signal light without regeneration. These amplifiers operate by pumping of charge carriers in the fiber with pump lasers to cause amplification of the signal light. For systems carrying several channels, more pump power and wider signal gain bandwidth are needed. A key feature of Raman amplification is the ability to increase the gain bandwidth by adding pump power at different wavelengths. Therefore, lasers which can emit light at several selected wavelengths, such as Distributed Feedback Lasers (DFB) are attractive for use in pumping Raman amplifiers.

One of the problems associated with Raman amplifiers is the onset of Stimulated Brillion Scattering (SBS) which generates noise and can reflect a significant fraction of the pump power intended to travel down the fiber. The threshold power at which such scattering occurs is a function of the line width of the pump light. Unfortunately, the line width of a typical DFB laser is small (usually less than 1 MHz), which results in a threshold of only about 1 mW. This severely limits the maximum pump power which can be used for Raman Amplifiers. The line width of the laser may be increased by applying an RF modulation. However, this approach is fairly complex and requires additional space for an RF generator.

It is desirable, therefore, to provide a semiconductor laser with a broadened line width. It is also desirable to have single mode emission from the laser so that the light can be coupled into a single mode fiber.

SUMMARY OF THE INVENTION

The invention in accordance with one aspect is an optical device which includes a grating and a waveguide coupled to the grating. The width of the waveguide varies along the length of the waveguide over at least a portion of the waveguide coupled to the grating in such a manner as to broaden the spectral line width of light from the device. In one embodiment, the width is varied according to a sinusoidal function.

In accordance with another aspect, the invention is an optical amplifier and a semiconductor laser coupled to the amplifier. The semiconductor laser includes a grating and a waveguide coupled to the grating. The width of the waveguide varies along the length of the waveguide over at least a portion of the waveguide coupled to the grating in such a manner as to broaden the spectral line width of light from the device. In one embodiment, the width is varied according to a sinusoidal function.

In accordance with another aspect, the invention is a method for forming an optical device which includes the step of forming a grating and a waveguide coupled to the grating and having a length and width over a semiconductor substrate such that the width of the waveguide varies along the length of the waveguide over at least a portion of the waveguide coupled to the grating in such a manner as to broaden the spectral line width of light output from the device region.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
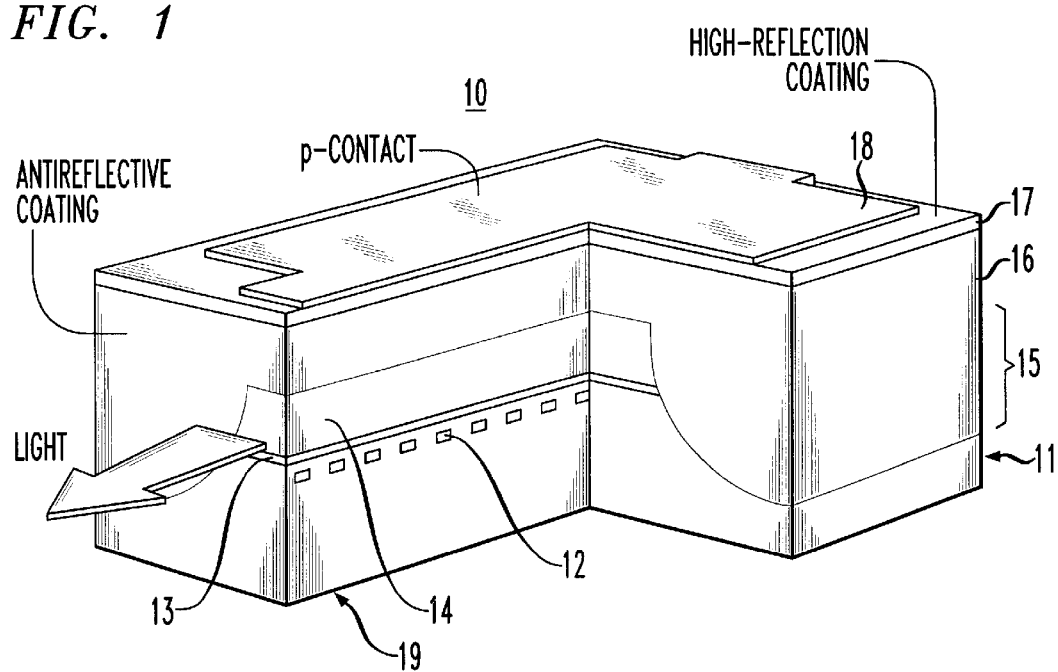
FIG. 1 is a schematic, partly cut away view of a semiconductor laser according to an embodiment of the invention.

FIG. 1 is a partly cut-away schematic view of a typical semiconductor laser device, 10, which may incorporate features of the invention. It should be appreciated that the invention is not limited to the particular device shown here, but can be employed with any optical device which includes a waveguide coupled to a grating.

The device is built upon a semiconductor substrate, 11, which in this example is n-type InP. A grating, 12, comprising periodic variations in index of refraction is formed in the substrate according to known techniques. The grating, 12, is covered by a layer, 13, preferably formed by MOCVD. In this example, the layer, 13, was InP.

An active stripe layer, 14, was formed, in a manner to be described, over the layer, 13. In this example, the active layer was a multi-quantum well layer including a plurality of InGaAsP well layers separated by InGaAsP barrier layers of different composition and also including InGaAsP separate confinement layers. It will again be appreciated that the composition of the active layer is not critical to the invention. The active layer is typically approximately .15 microns thick. The width of the active stripe is defined by a current blocking layer, 15, formed on either side of the stripe. This blocking layer is typically one or more layers each of n-type and p-type InP.

A cladding layer, 16, is preferably formed over the active and blocking layers, again by MOCVD. This layer is typically p-type InP and is approximately 2 microns thick. The cladding layer is covered by a cap layer, 17, again by MOCVD. In this example, the cap layer is p-type InGaAs with a thickness of approximately 500 angstrom. A p-type metal contact, 18, is deposited on the cap layer, 17, and an n-type metal contact, 19, is deposited on the bottom of the substrate, 11.

Figure 2:
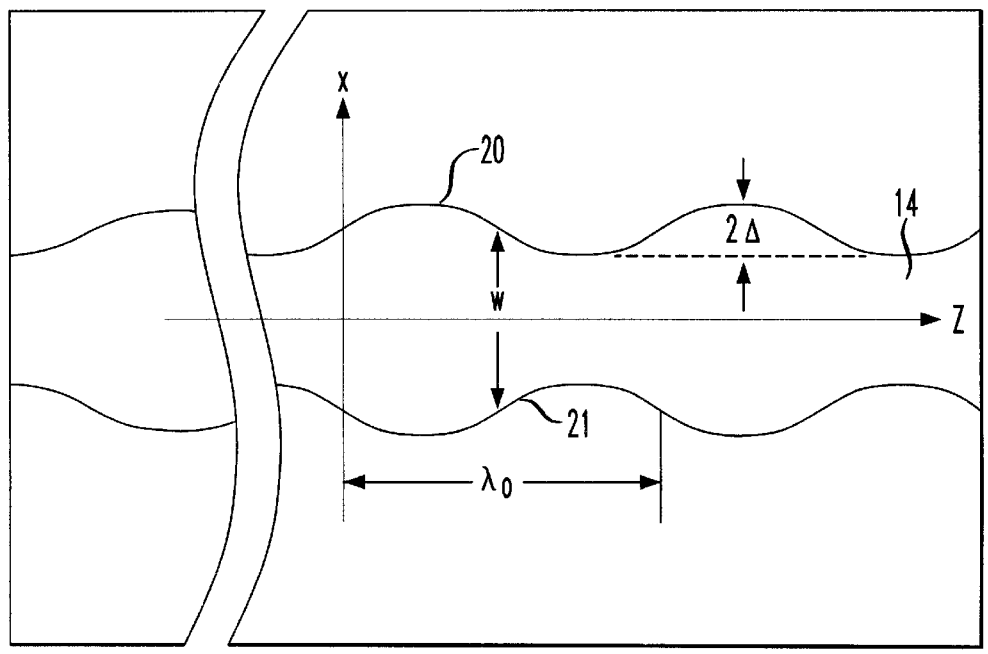
FIG. 2 is a plan view of the laser of FIG. 1.

FIG. 2 illustrates in a plan view (greatly exaggerated) a desired shape for the active layer, 14. The "X" and "Z" directions are illustrated. It will be noted that the width, w, of the active layer, 14, is not constant, but is a function, w(z), of the position along the "Z" direction, which is the direction of light propagation. In this example, the boundaries, 20 and 21, of the active region are sinusoidal. That is, the width can be expressed as:

$$W(z) = w_0 + 2\Delta \sin(2\Pi z/\Lambda_0)$$

where z is the distance along the laser cavity, $w_0$ is the average value of the width, and $\Delta$ and $\Lambda_0$ are the amplitude and period of the sinusoidal boundaries. In one example, $w_0$ is 2.4 microns, $\Delta$ is 0.1 microns, and $\Lambda_0$ is 75 microns. The effective refractive index at the widest and narrowist portions of the active region are 3.16891 and 3.17071, respectively. The corresponding wavelengths of DFB modes are 1475.55 nm and 1476.38 nm.

Figure 3:
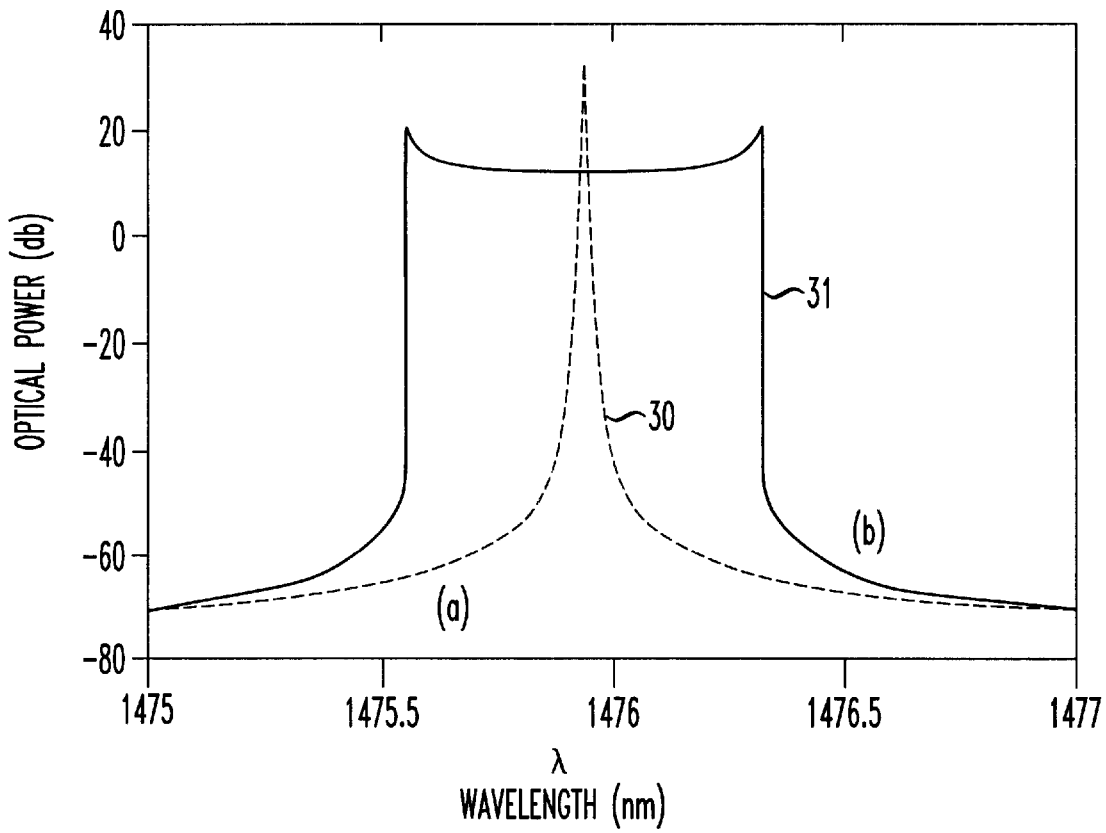
FIG. 3 shows the spectrum of light emitted from the laser of FIGS. 1 and 2 as compared with a prior art laser.

FIG. 3 illustrates the optical spectrum (light power v. wavelength) for a typical single mode DFB laser with a constant active region width (curve 30) and a DFB laser according to the above example (curve 31). Curve 31 was calculated assuming that the grating reflectivity was proportional to the length, the gain for each section of the cavity was the same, and the shape of the spectrum was Lorentzian. The spectral width for the typical laser was 0.007 pm (1 MHz) and for the inventive laser was 0.8 nm (110 GHz). Thus, the spectral width employing the variable active layer width was increased more than one hundred thousand times. It is desirable that the line width be at least 1 GHz to produce adequate transmission of the pump power down a fiber.

Figure 4:
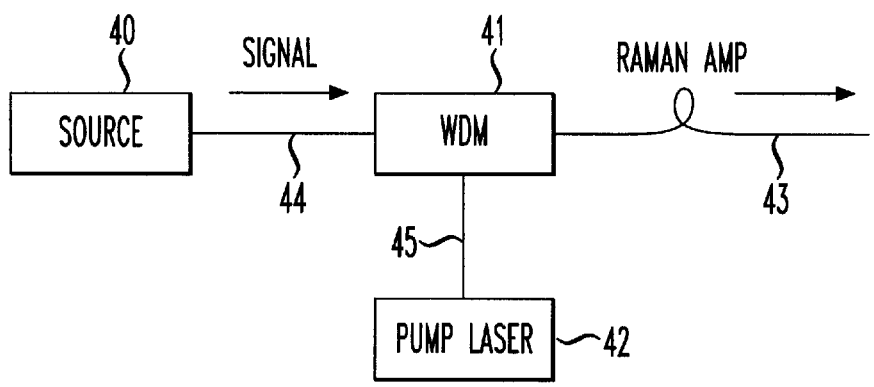
FIG. 4 is a schematic view of a semiconductor laser and Raman amplifier combination in accordance with an embodiment of the invention.

FIG. 4 illustrates one example of a portion of an optical network which can incorporate the above-described laser. A source of signal light, 40, is coupled by means of fiber, 44, to a Wavelength Division Multiplexer (WDM), 41. The pump laser, 42, which can be the device according to FIG. 1, is also coupled to the WDM, 41, by means of a single mode fiber, 45. The combined signal and pump light from the WDM, 41, is coupled to a Raman Amplifier, 43. The pump light causes the Raman Amplifier to amplify the signal light for further transmission.

It is known that the onset of Stimulated Brillouin Scattering (SBS) will be a function of the line width of the pump light. With typical prior art pump lasers having a line width of less than 1 MHz, the threshold pump power was less than 10 mW. While not being bound by any theory, it appears that the broadened line width of lasers according to the invention will permit greater pump power to the Raman amplifier without producing SBS. For example, using the laser described above with a line width of about 110 GHz, the threshold pump power is increased to more than 10 W. A desired minimum pump power is 100 mW.

Figure 5:
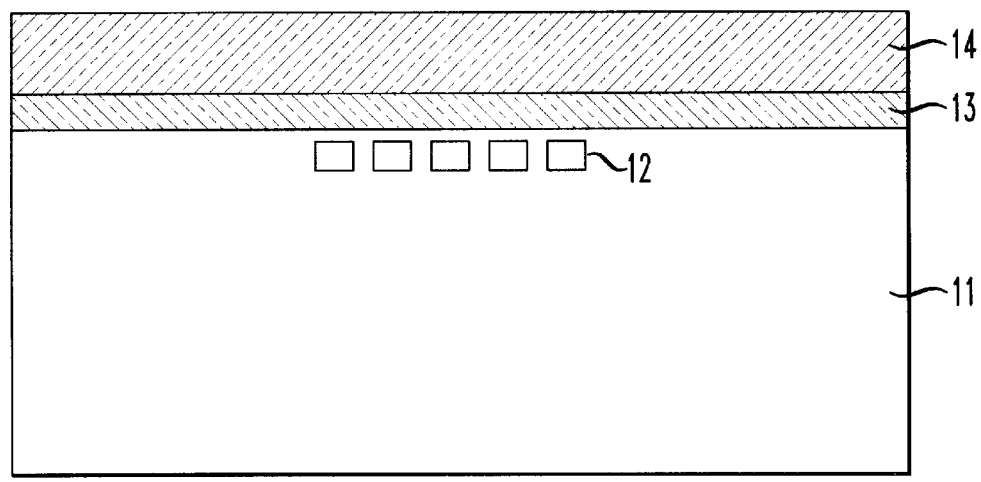
FIGS. 5–10 are cross-sectional views of a laser during various stages of fabrication in accordance with an embodiment of the method aspects of the invention.

FIGS. 5–10 illustrate a series of steps which may be employed in accordance with an embodiment of the method aspect of the invention. In FIG. 5, the grating, 12, and layer 13 have already been formed by known techniques. Likewise, the active layer, 14, which is usually a series of quantum well layers separated by barrier layers and includes separate confinement layers, has been deposited on essentially the entire surface of the layer 13 by standard techniques such as Metal Organic Chemical Vapor Deposition (MOCVD).

Figure 6:
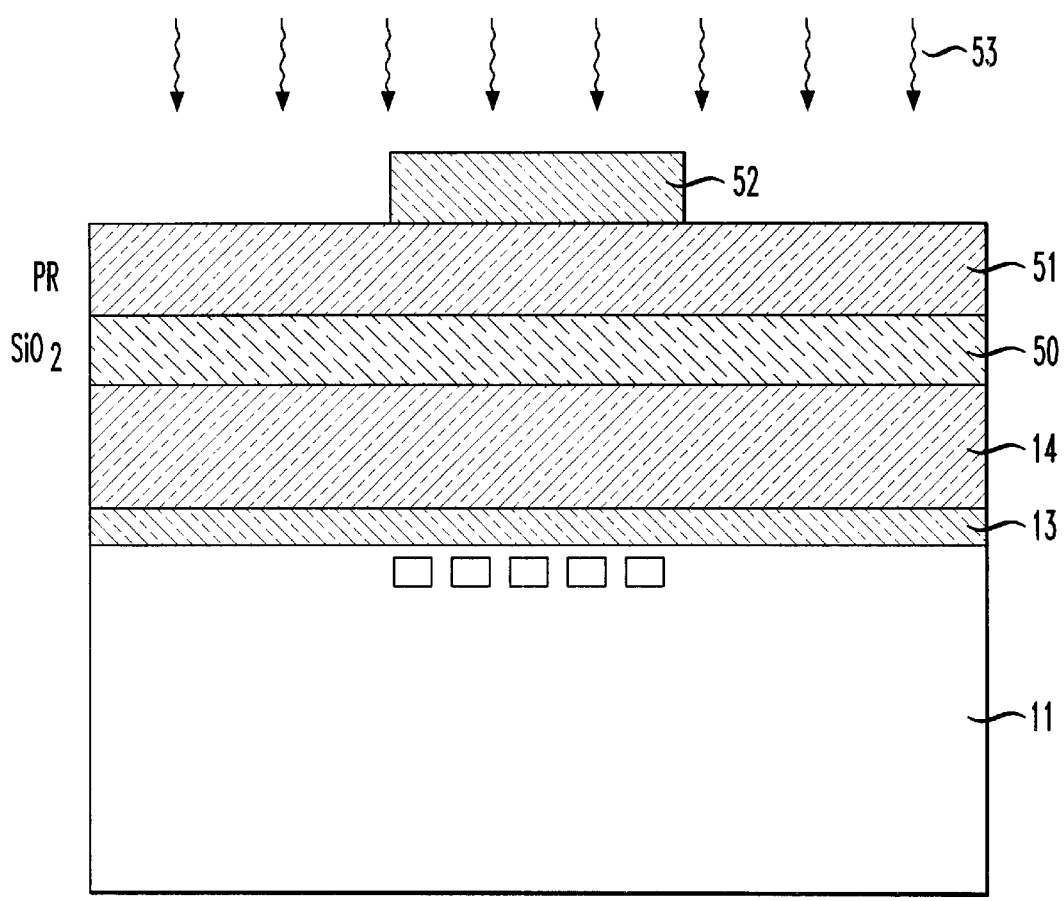
Figure 7:
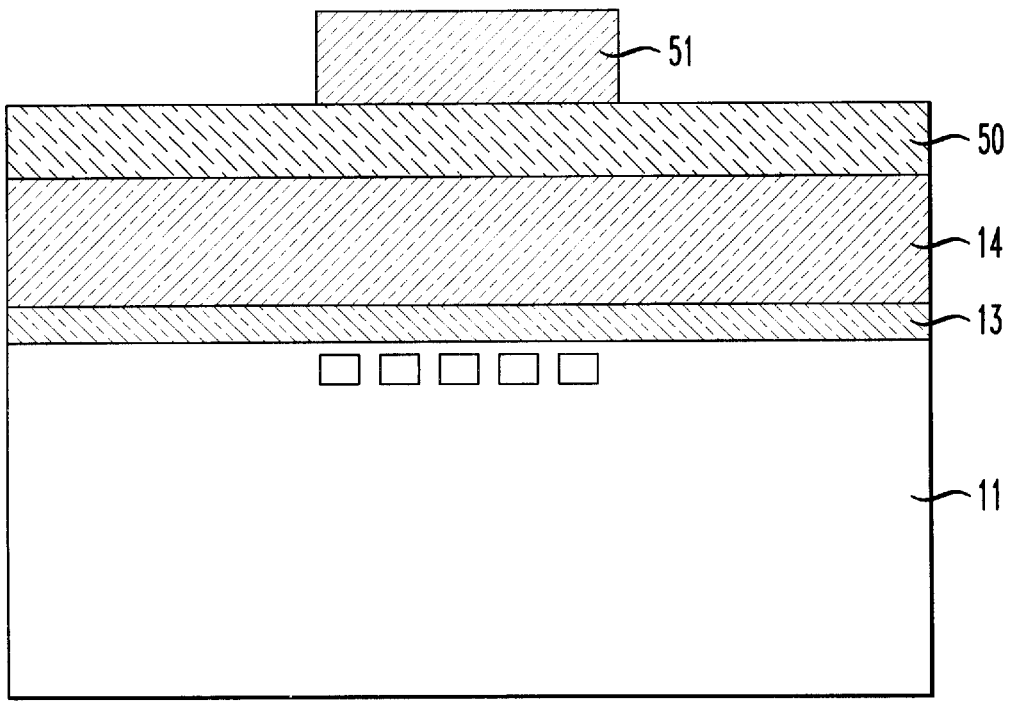

As illustrated in FIG. 6, a dielectric layer, 50, such as silicon dioxide, is deposited over essentially the entire surface of the active layer, 14, by standard techniques (e.g., Plasma Enhanced Chemical Vapor Deposition). This is followed by the deposition of a standard photoresist layer, 51, on the dielectric layer, 50. An exposure mask, 52, with a shape having edges corresponding to the outline of the desired active layer boundaries (20 and 21 of FIG. 2) is placed on the photoresist layer, 51. The structure is exposed to light, 53, the mask, 52, is removed, and the photoresist, 51, is developed by etching the exposed portions of the photoresist to produce the structure of FIG. 7.

Figure 8:
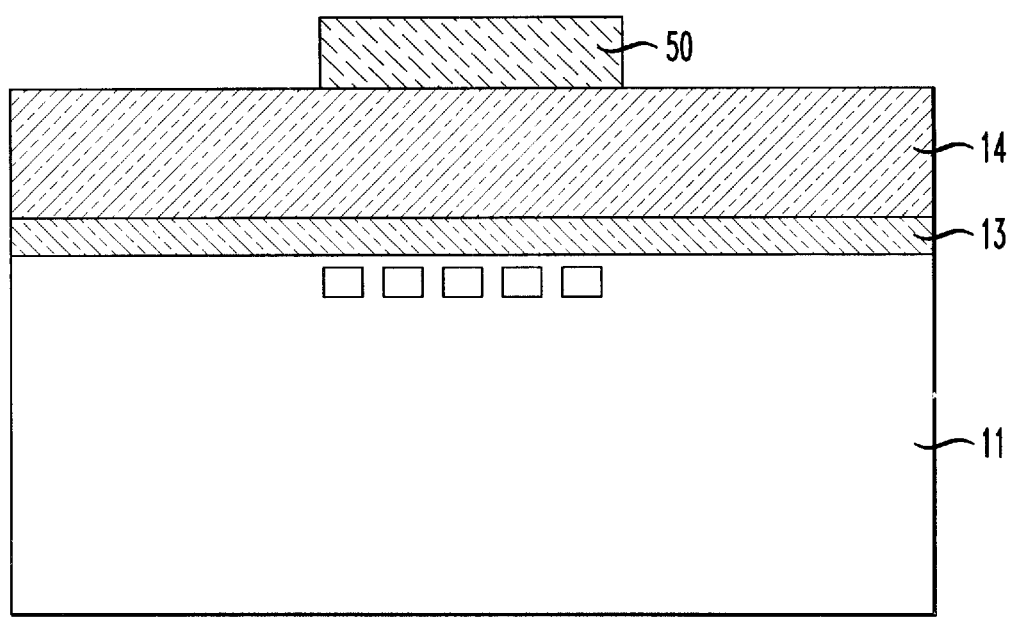
Figure 9:
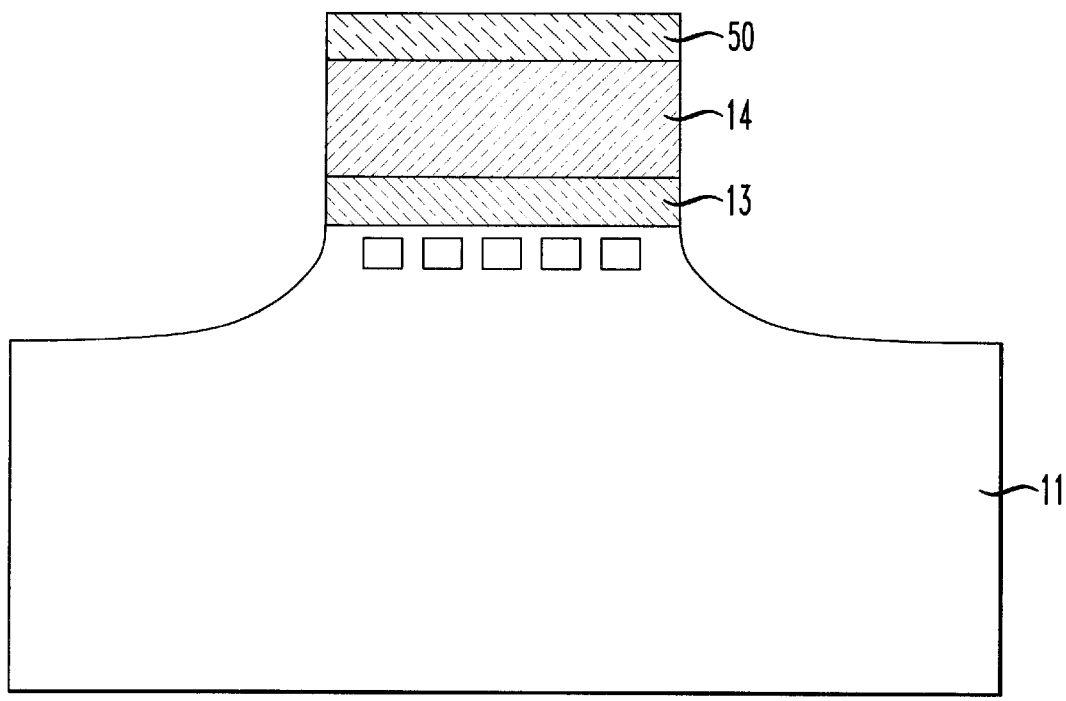
Figure 10:
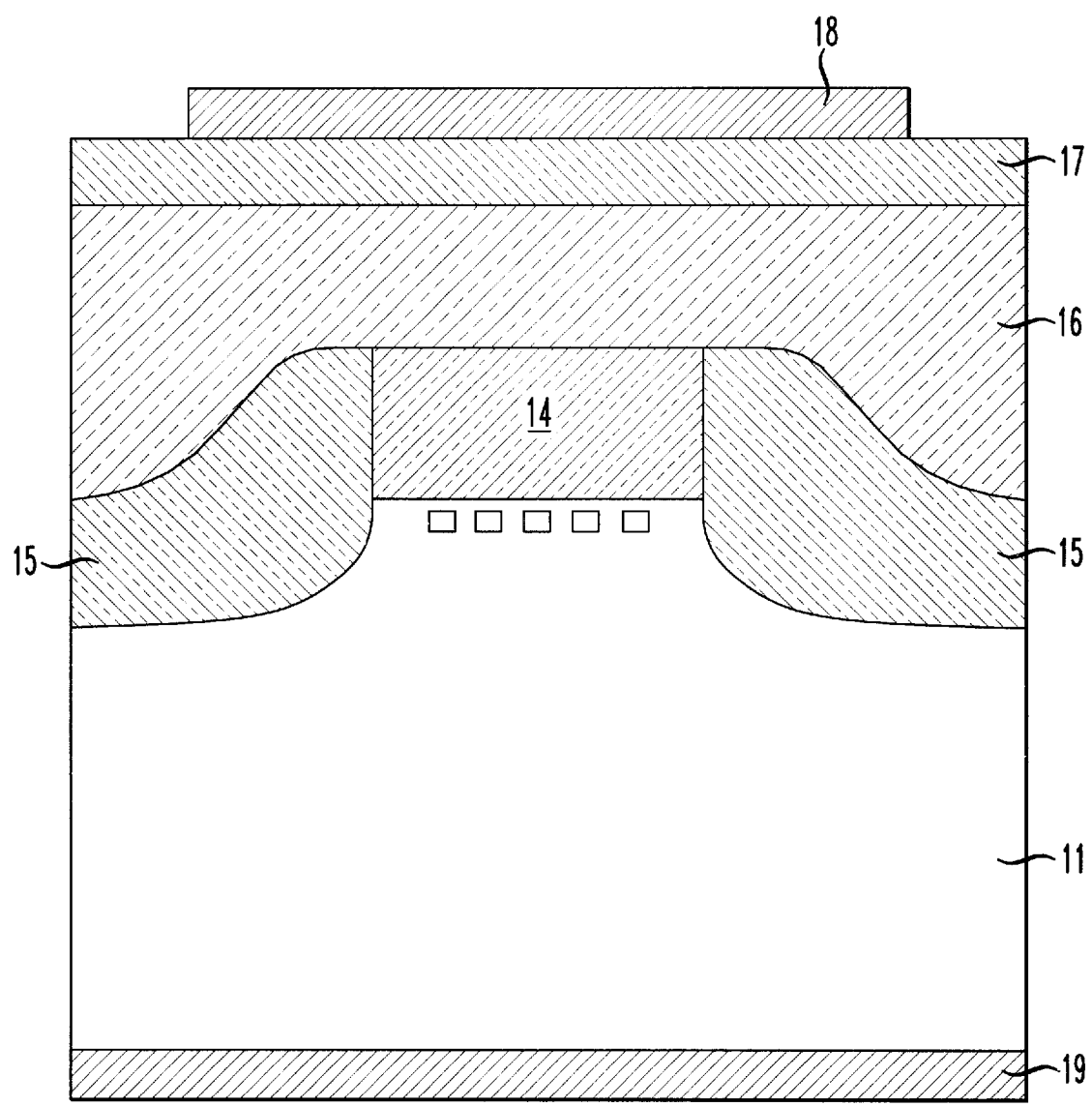

The dielectric layer, 50, is then etched using the remaining photoresist layer as a mask, and the photoresist mask is then removed to produce the structure of FIG. 8. The dielectric mask, 50, now has the same shape as the original exposure mask, 52. The exposed portion of the active layer, 14, is then etched, typically by wet chemical etchants along with the exposed portion of the underlying layer 13, and a portion of the substrate, 11, to produce the structure of FIG. 9. The active layer, 14, now has the desired shape shown in FIG. 2. The device is then completed by depositing, using standard techniques, the blocking layer, 15, the cladding layer, 16, and the cap layer, 17, as well as the electrodes, 18 and 19 as illustrated in FIG. 10.

While the invention has been described with reference to sinusoidal active region boundaries, it will be appreciated that other shapes may be employed. What is desired is a gradual change in width of the active region along the length of the cavity (Z direction) over at least one-half of the area over the grating. Therefore, a boundary with a slope of at least $2 \times 10^{-4}$ and a maximum slope of 0.1 is preferred.

Figure 11:
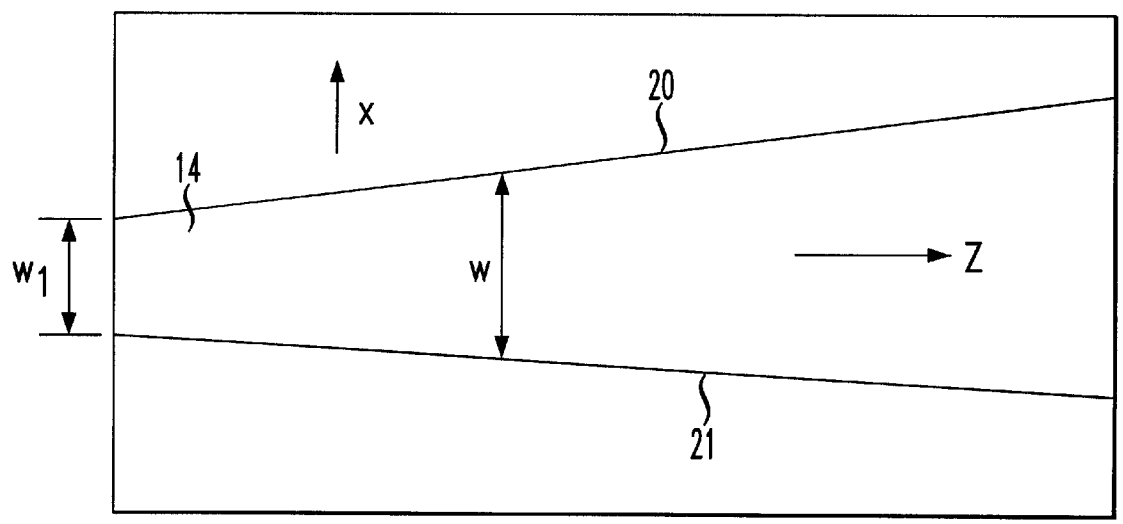
FIG. 11 is a plan view of a laser in accordance with another embodiment of the invention.

FIG. 11 illustrates an alternative embodiment, again greatly exaggerated, where the boundaries, 20 and 21, of the active layer, 14, are straight lines and the width, w, varies along the direction of light propagation (Z direction) according to the relationship:

$$W(z) = w_0 + 2zs$$

Where $w_0$ is the width at the beginning of the laser cavity, z is the distance along the laser cavity, and s is the slope of the boundary lines.

It will be appreciated that other shapes for the boundaries, such as saw tooth, can be employed.

It will also be appreciated that the invention is not limited to DFB lasers, but may also be advantageous for Distributed Bragg Reflector (DBR) lasers. In the latter case, the grating will be optically coupled to a passive, rather than active, portion of the waveguide (which waveguide would also include an active region for light emission but remote from the grating). Therefore, in such a device, it is important to vary the width of the passive waveguide over a significant part of the waveguide (at least one-half) which is coupled to the grating. In fact, the invention is not limited to semiconductor lasers, but may be applicable wherever a waveguide (active or passive) is optically coupled to a grating in order to broaden the spectral line width of the device at selected wavelengths.

What is claimed is:

1. An optical device comprising a grating and a waveguide coupled to the grating, wherein the waveguide has a width that varies and is non-flared over at least a portion of the waveguide coupled to the grating in such a manner as to broaden the spectral line width of light output from the device, wherein boundaries of the waveguide along at least the non-flared portion are selected from sinusoidal and saw tooth shapes.

2. The device according to claim 1 wherein the waveguide has boundaries with a slope of at least $2 \times 10^{-4}$.

3. The device according to claim 2 wherein the boundaries are sinusoidal.

4. The device according to claim 2 wherein the boundaries are saw tooth shaped.

5. The device according to claim 1 wherein the device is a distributed feedback laser.

6. The device according to claim 1 wherein the width of the waveguide is varied to produce light having a line width of at least 1 GHz.

7. The device according to claim 1 wherein the width is such as to produce single mode light emission.

8. The device according to claim 1 wherein the waveguide includes an active region comprising a multiquantum well layer.

9. Apparatus comprising:

an optical amplifier; and a semiconductor laser coupled to the amplifier, the semiconductor laser including a grating and a waveguide coupled to the grating wherein the waveguide has a width that varies and is non-flared along the length of the waveguide over at least a portion of the waveguide coupled to the grating in such a manner as to broaden the line width of light output from the device, wherein boundaries of the waveguide along at least the non-flared portion are selected from sinusoidal and saw tooth shapes.

10. The apparatus according to claim 9 wherein the amplifier is a Raman amplifier.

11. The apparatus according to claim 10 wherein the line width is such as to produce power of at least 100 mW without producing significant Brillouin Scattering in the amplifier.

12. The apparatus according to claim 9 wherein the light emission is single mode.

13. The apparatus according to claim 9 Wherein the waveguide has boundaries with a slope of at least $2\times10^{-4}$.

14. The apparatus according to claim 9 wherein the device is a distributed feedback laser.

15. The apparatus according to claim 9 wherein the width of the waveguide is varied to produce light having a line width of at least 1 GHz.

16. A method for forming an optical device which includes the steps of forming a grating and a waveguide coupled to the grating such that the waveguide has a width that varies and is non-flared over at least a portion of the waveguide coupled to the grating in such a manner as to broaden the spectral line width of light output from the device, wherein boundaries of the waveguide along at least the non-flared portion are selected from sinusoidal and saw tooth shapes.

17. The method according to claim 16 wherein the boundaries are formed by etching the waveguide through a mask.

18. The method according to claim 17 wherein the mask is formed by etching the mask through a photoresist mask.

19. The method according to claim 16 wherein the waveguide comprises a multiquantum well active layer.

20. The method according to claim 16 wherein a blocking layer is formed adjacent to the boundaries of the waveguide.

21. The method according to claim 16 wherein the boundaries are formed with a slope of at least $2\times10^{-4}$.

* * * * *